United States Patent
Song et al.

(10) Patent No.: US 6,888,261 B2
(45) Date of Patent: May 3, 2005

(54) ALIGNMENT MARK AND EXPOSURE ALIGNMENT SYSTEM AND METHOD USING THE SAME

(75) Inventors: Won Song, Seoul (KR); Seong-Il Kim, Suwon (KR); Sang-Il Han, Seoul (KR); Chang-Hoon Lee, Seoul (KR); Choung-Hee Kim, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/690,105

(22) Filed: Oct. 21, 2003

(65) Prior Publication Data

US 2004/0087249 A1 May 6, 2004

Related U.S. Application Data

(62) Division of application No. 09/906,306, filed on Jul. 16, 2001, now Pat. No. 6,667,253.

(30) Foreign Application Priority Data

Jan. 12, 2001 (KR) .......................................... 2001-1733

(51) Int. Cl.[7] .................... H01L 23/544; H01L 21/76
(52) U.S. Cl. ..................................... 257/797; 438/975
(58) Field of Search ........................ 257/797; 438/401, 438/509, 462, 975; 356/401, 509

(56) References Cited

U.S. PATENT DOCUMENTS

| | | | | |
|---|---|---|---|---|
| 5,601,957 A | * | 2/1997 | Mizutani et al. | 430/22 |
| 5,917,604 A | * | 6/1999 | Dirksen et al. | 356/401 |
| 6,255,189 B1 | | 7/2001 | Muller et al. | 438/401 |
| 6,285,455 B1 | | 9/2001 | Shiraishi | 356/486 |

FOREIGN PATENT DOCUMENTS

KR  2000-0047405  8/2000

OTHER PUBLICATIONS

*Silicon Processing for the VLSI Era*, vol. 1: Process Technology, published in 1986 by Lattice Press of Sunset Beach, California, pp. 459–473.

\* cited by examiner

*Primary Examiner*—Shouxiang Hu
(74) *Attorney, Agent, or Firm*—Mills & Onello, LLP

(57) ABSTRACT

An alignment mark and an exposure alignment system and method using the alignment mark for aligning wafers are described. The alignment mark is formed of a plurality of mesa or trench type unit marks that are aligned in an inline pattern within an underlying layer under a layer to which a chemical mechanical polishing process is applied to form an alignment signal during an alignment process, thereby preventing a dishing phenomenon caused by the chemical mechanical process.

6 Claims, 11 Drawing Sheets

ALIGNMENT MARK AND EXPOSURE ALIGNMENT SYSTEM AND METHOD USING THE SAME

RELATED APPLICATIONS

This application is a divisional of U.S. application Ser. No. 09/906,306, filed on Jul. 16, 2001, U.S. Pat. No. 6,667,253 the contents of which are incorporated herein in their entirety by reference.

BACKGROUND OF THE INVENTION

1. Field of the Invention

The present invention relates to an alignment mark and an alignment mark design method by which wafers are aligned to correspond with masks in an exposure aligning system.

2. Description of the Related Art

Generally, semiconductor devices are fabricated by performing repeated and selective processes such as patterning, etching, diffusing, metal-deposition, etc., to form one or more circuit patterning layers on a wafer. The deposition of circuit patterning layers requires that previously formed circuit patterning layers be aligned accurately.

In the alignment relationship of wafers, the alignment marks formed on exposure field regions EFn or scribe lines SCL of a wafer are illuminated by a light source and reflect diffracted light rays. The diffracted light rays from the alignment marks are detected to generate a photoelectric signal which is used to detect the position of the wafer. The position state of the wafers is checked and the wafers are aligned by an alignment means to meet predetermined reference positions to complete the alignment of the wafers.

In such a conventional technique, the alignment marks shown in FIGS. 1A to 2B are used in a through the lens (TTL) type of field image alignment system in which a red color laser beam (633 nm) is used, and are generally formed of patterns in which a plurality of unit marks are aligned at both sides of the reference position thereof.

The unit mark of the alignment marks shown in FIG. 1 has a width of about 6 to 8.5 and length (l) of about 30 to 40 in a rectangular form. The gap Q between the unit marks is in the range of about 6 to 8.5 to which the width (t) of the unit mark is similar in the aligning direction of the plurality of unit marks. The pitch (P) is in the range of about 12~17.

If these alignment marks are changed in form in the course of performing various process steps, or covered with process layers including metal layers, there is a problem that both sides of the unit mark are not in a symmetrical form (asymmetry), as shown in FIG. 3. Such an asymmetrical form in the unit mark causes a range of error (d) in the position detection as shown in FIG. 4, which shows a graph illustrating the relationship of detected positions to a signal waveform (contrast).

In addition, the aforementioned unit mark has therein a dishing phenomenon by which its center position gets depressed compared with both end sides of the unit mark during a chemical mechanical polishing CMP process, as shown in FIG. 5 or 6. This phenomenon also causes the range of error (d') in the position detection of the alignment mark, as shown in FIG. 7, which shows a graph illustrating the relationship of the position detection by contrast.

In an attempt to solve such problems, Korea Patent Application No. 10-2000-47405 discloses changing a conventional rectangular type of unit mark alignment pattern to a matrix type in the alignment marks. However, such a technique cannot be performed on a conventional alignment system. In addition, there is a problem that accuracy in measurement of alignment position is low, and reliability in the position detection is also reduced because the position of the alignment marks is measured by using a predetermined single wavelength of light that does not affect the sensitivity to light, of photoresist.

SUMMARY OF THE INVENTION

In order to solve the aforementioned problems, an object of the present invention is to provide an alignment mark and an aligning method using the same, which can be implemented in a conventional alignment system. Each of the unit marks forming the alignment marks is further formed of a mesa or trench pattern therein so as to have detection signals of high order diffraction beams using different type wavelength beams, thereby resulting in more accurate alignment marks.

In addition, another object of the present invention is to provide an alignment mark and an aligning method using the same by which a dishing phenomenon and the resultant alignment error, occurring as a result of a chemical mechanical polishing process, can be prevented.

In accordance with the invention, the alignment mark of the invention includes a plurality of mesa or trench type unit marks aligned in line and spaced apart from one another with a predetermined gap therebetween formed in an underlying layer to which a chemical mechanical polishing process is applied. Alignment signals are formed during an alignment process. The unit mark is made by aligning at least one or more mesa or trench patterns in order to prevent a dishing phenomenon during a chemical mechanical polishing process.

The mesa patterns can be formed with a predetermined pitch within the trench type of unit mark, and the trench patterns can be formed with a predetermined pitch within the mesa type of unit mark. Alignment signals from each of the unit marks are formed by at least three or more diffraction beam orders.

The mesa patterns or trench patterns can be parallel to the lengthwise direction of the unit mark and aligned in a width direction of the unit mark, relative to the rectangular form of unit mark having a predetermined length and width.

The pattern pitch P' of the mesa or trench pattern is determined by the formula, $$P' = P/(2n'+1) \ (n': \text{natural number}),$$

wherein P sin θ=nλ, P: pitch between unit marks, λ: wave length of laser beam, θ: diffraction angle, n': the number of mesa or trench patterns, n: diffraction order of unit mark, λ': wave length of different laser beam for illuminating the mesa or trench patterns, 2n'+1: diffraction order by the wave length λ' of different lasers.

In addition, in one embodiment, when the pitch P between the unit marks is in the range of 7.9 to 8.2 $\mu$m, the pattern width t' and pattern pitch P' of the mesa or trench patterns are formed in the range of 2.65–2.67 $\mu$m and in the range of 5–5.4 $\mu$m, respectively, when the diffraction order 2n'+1 is 3. The pattern width t' and pattern pitch P' of the mesa or trench patterns can be formed in the range of 1.59–1.61 $\mu$m and in the range of 3.1–3.3 $\mu$m, respectively, when the diffraction order 2n'+1 is 5. The pattern width t' and pattern pitch P' of the mesa or trench patterns are formed in the range of 1.13–1.15 $\mu$m and in the range of 2.27–2.29 $\mu$m, respectively, when the diffraction order 2n'+1 is 7.

In accordance with the alignment method according to the present invention, mesa or trench patterns are aligned for forming a reverse image on each of mesa or trench type of unit marks. A first probing beam generating means and a second probing generating means are provided for illuminating the unit marks. Each of the unit marks aligned with the first probing beam is illuminated to confirm contrast between each of the unit marks and non-marked portions. Each of the unit marks is illuminated with the second probing beam to thereby confirm contrast between portions formed and portions not formed with the mesa or trench patterns. A mark center is determined by each of contrast values measured through the first and second probing beams.

In one embodiment, the first probing beam is a red color laser beam having an approximate 633 nm-wavelength band by which photoresist coating a wafer cannot be sensitized, and the second probing beam is a green color laser beam having a 532 nm-wavelength band by which photoresist coating a wafer cannot be sensitized.

The mark center position can be determined based on a maximum contrast value among the contrast values measured by illuminating the unit marks with the first probing beam and by illuminating the mesa or trench pattern with the second probing beam. Alternatively, the mark center position can be determined based on an average contrast value measured by illuminating the unit marks with the first probing beam and by illuminating the mesa or trench pattern with the second probing beam. In another alternative embodiment, the mark center position can be determined based on only the maximum contrast value measured by illuminating the mesa or trench pattern with the second probing beam, or determined based on only the average contrast value measured by illuminating the mesa or trench pattern with the second probing beam.

BRIEF DESCRIPTION OF THE DRAWINGS

The foregoing and other objects, aspects and advantages will be better understood from the following detailed description of preferred embodiments of the present invention with reference to the drawings.

DETAILED DISCRIPTION OF THE PREFERRED EMBODIMENTS

Hereinafter, the alignment mark, alignment system, and the alignment method of the invention will be described with reference to the accompany drawings according to preferred embodiments of the invention.

As shown in FIGS. 8A through 9B, the alignment marks according to the present invention are comprised of a plurality of mesa or trench type of unit marks formed on an underlying layer of a layer to which a chemical mechanical polishing process is applied, that is, on a semiconductor substrate or insulating layer, thereby being aligned with a predetermined gap therebetween.

The type and alignment of each of the unit marks serve to form alignment signals by diffracting each of the different wavelength beams from the exposure alignment system.

The exposure alignment system for illuminating the alignment marks according to the present invention is provided therein with a light source comprised of at least two or more light beam sources including, in one particular embodiment, a 633 nm wavelength type beam source and a 532 nm wavelength type beam source which can be selected to illuminate the alignment marks.

The light provided from the light source may be indicated as laser beams. Hereinafter, the red color beam of 633 nm wavelength will be referred to as a "first probing beam" and the green color beam of 532 nm wavelength will be referred to as a "second probing beam".

As shown in FIGS. 8A through 9B the alignment marks are formed such that at least one or more mesa patterns M or trench patterns T are aligned within each of the unit marks, spaced apart from one another. As a result, a dishing phenomenon can be prevented during a chemical mechanical polishing process.

Figure 8A:
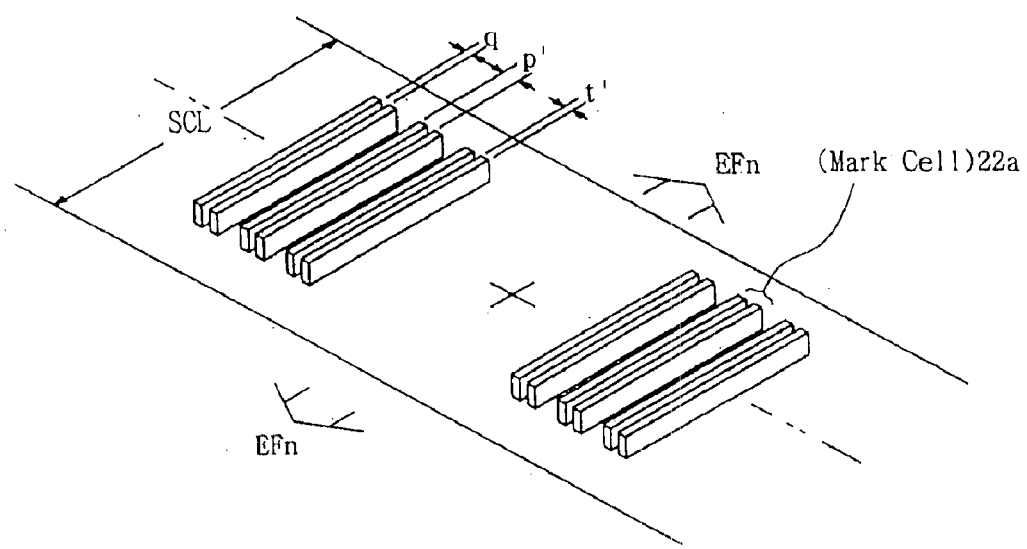
FIGS. 8A through 9B are perspective views showing examples of align marks according to the present invention.
Figure 8B:
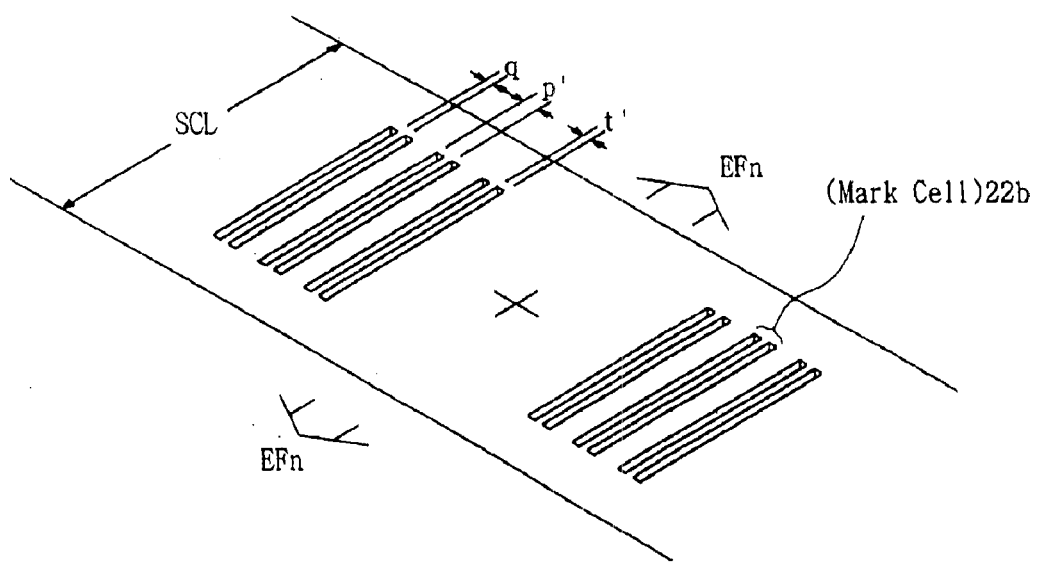
Figure 9A:
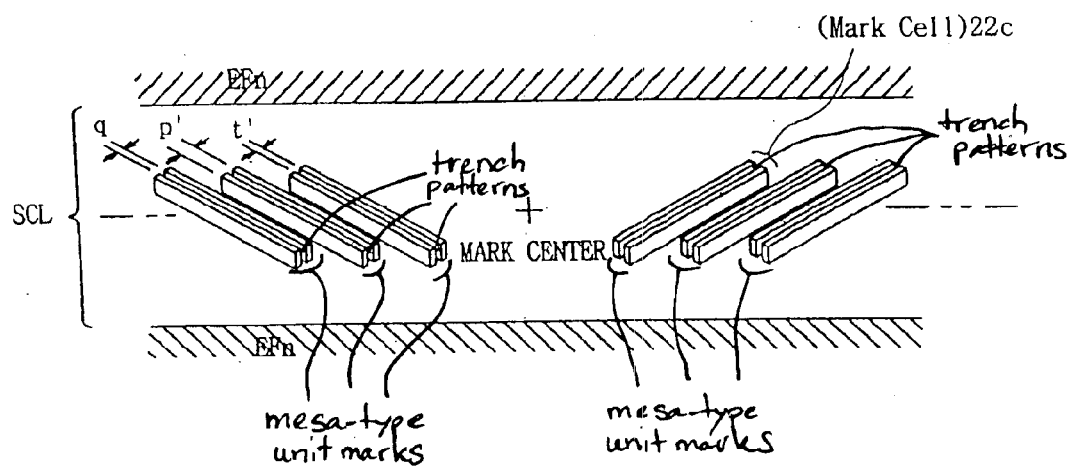
Figure 9B:
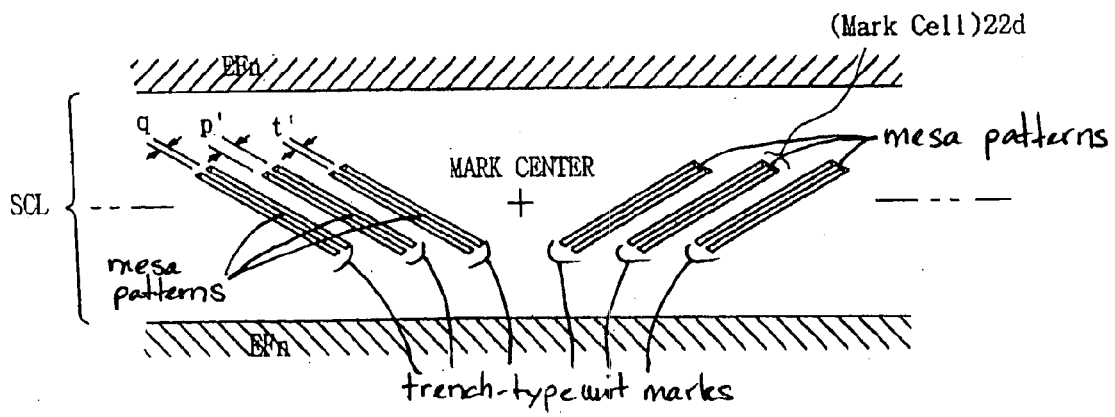

The mesa pattern M, as shown in FIGS. 8B and 9B, is formed in a reverse image to the trench type of unit mark with a predetermined pitch P'. The trench pattern T, as shown in FIGS. 8A and 9A, is formed in a reverse image to the mesa type of unit mark with a predetermined pitch P'. The patterns serve to divide alignment signals from each of the unit marks into at least three or more diffraction orders (2n'+1).

When each of the unit marks is a rectangular form having a predetermined length and width, the mesa patterns M or trench patterns T, as shown in FIGS. 8A through 9B, are parallel to the length direction of the unit mark in its length and aligned in a direction of the width of the unit mark.

The pattern pitch P' of the mesa or trench pattern is determined by the formula, $$P'=P/(2n'+1)\pm 0.05 \, \mu m \, (n': \text{natural number}),$$

wherein $P \sin \theta = n\lambda$, P: pitch between unit marks, $\lambda$: wavelength of laser beam, $\theta$: diffraction angle, n': the number of mesa or trench patterns, n: diffraction order of unit mark, $\lambda'$: wavelength of the second probing beam for illuminating the mesa or trench patterns, 2n'+1: diffraction order by the wavelength $\lambda'$ of different lasers.

In addition, when the pitch P between the unit marks is in the range of 7.9 to 8.2 $\mu m$, the pattern width t' and pattern pitch P' of the mesa pattern M or trench pattern T are formed in the range of 2.65–2.67 μm and in the range of 5–5.4 μm, respectively, in case that the diffraction order 2n'+1 is 3; the pattern width t' and pattern pitch P' of the mesa or trench patterns are formed in the range of 1.59–1.61 μm and in the range of 3.1–3.3 μm, respectively, in case that the diffraction order 2n'+1 is 5; and the pattern width t' and pattern pitch P' of the mesa or trench patterns are formed in the range of 1.13–1.15 μm and in the range of 2.27–2.29 μm, respectively, in case that the diffraction order 2n'+1 is 7.

Figure 10A:
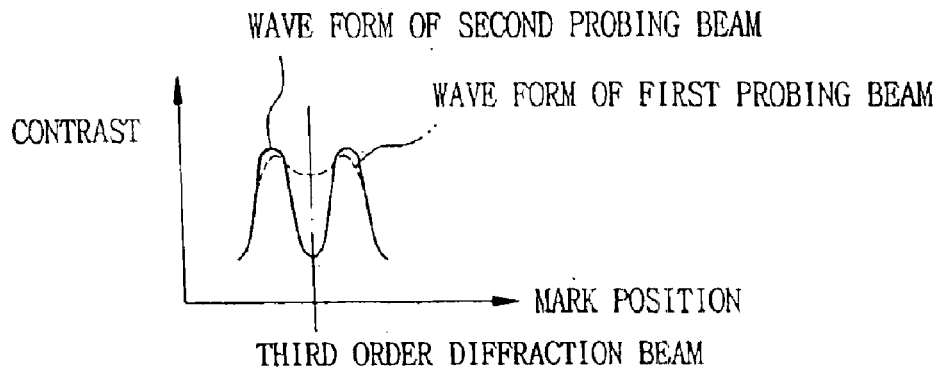
FIGS. 10A through 10C are graphs showing the relationship of various diffraction orders and contrasts diffracted from the mesa type of unit mark, resulting from the illumination of the first and second probing beams, according to the present invention.
Figure 10B:
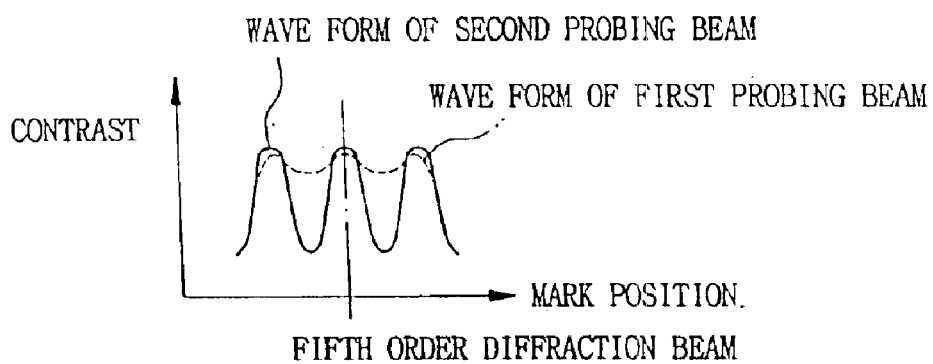
Figure 10C:
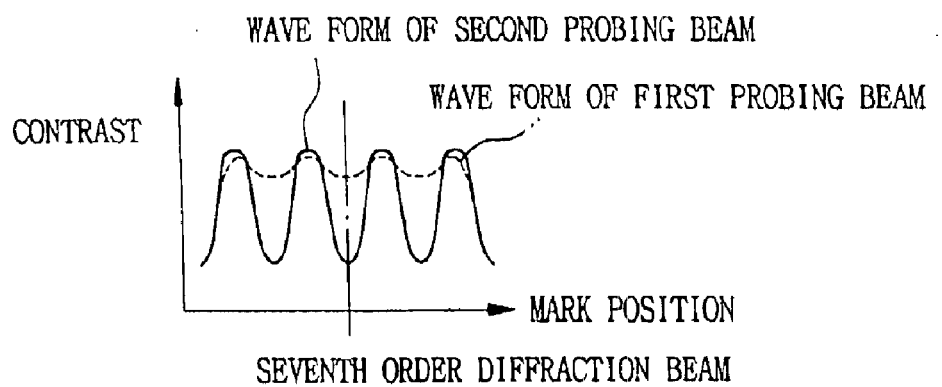
Figure 11A:
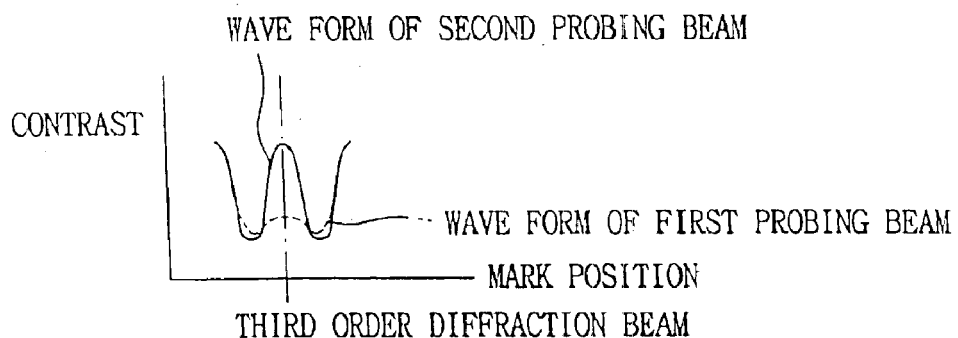
FIGS. 11A through 11C are graphs showing the relationship of various diffraction orders and contrasts diffracted from the trench type of unit mark, as a result of the illumination of the first and second probing beams according to the present invention.
Figure 11B:
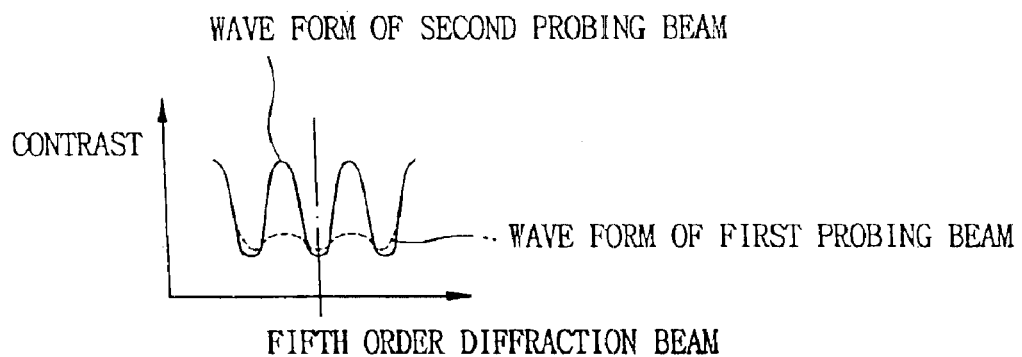
Figure 11C:
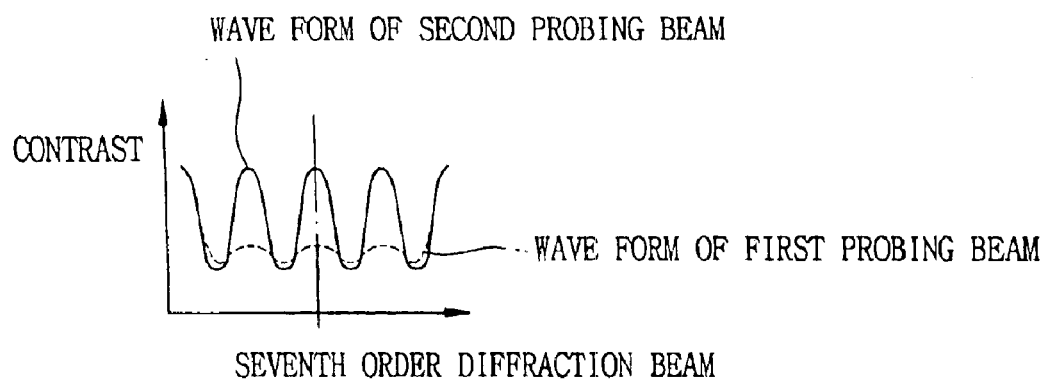

Accordingly, if each of the unit marks as shown in FIGS. 8A through 9B is illuminated with the first probing beam, each of the contrast values is detected as shown in the graphs of FIGS. 10 to 10C. In addition, if each of the unit marks is illuminated with the second probing beam, each of the contrast values of the mesa pattern M or trench pattern T can be detected as shown in the graphs of FIGS. 11A to 11C.

The processes of aligning wafers W with reference to such alignment marks in accordance with an embodiment of the invention will now be described in detail with reference to the drawings. The alignment marks are formed by at least one or more unit marks being aligned on predetermined portions of the wafers W, that is, on the predetermined field regions EFn or on the scribe line SCL. The alignment marks are illuminated with the first probing beam, and accordingly the contrasts as shown in FIGS. 10A through 10C are formed by the first probing beam diffracted from each of the unit marks. The mark center can be determined based on the maximum value selected from the contrast values and can also be determined by an average value of each of the unit mark center positions detected by those contrasts.

Therefore, the detection of the positions of the unit marks and the mark center detected by the illumination of the first probing beam can be performed for support of the conventional alignment system that is not provided with a light source for generating a different wavelength beam, i.e., the second probing beam.

Next, the mesa pattern M or trench pattern T in each of the unit marks is illuminated with the second probing beam. Accordingly, the contrasts diffracted from each of the mesa pattern M or trench pattern T are formed. As a result, the mark center can be determined based on the maximum value selected from the contrast values and can also be determined by an average value of the unit mark center positions detected by those contrasts.

The mark center can be determined based on the maximum value selected from the contrast obtained by the second probing beam illuminating the mesa pattern M or the trench pattern T and the contrast obtained by the first probing beam illuminating the unit marks 22a, 22b, 22c, 22d. Alternatively, the mark center can also be determined based on an average value of the mark center positions indicated by each of the contrasts.

Among these relationship, it is desirable that the mark center be determined based on the maximum value selected from the contrasts obtained by the second probing beam illuminating the mesa pattern M or the trench pattern T which are formed in each of the unit marks. Or, it is desirable that the mark center be determined based on an average value of the mark center positions indicated by each of the contrasts.

FIGS. 12A through 14B indicate that using the diffraction order 2n'+1 diffracted from the mesa pattern M or trench pattern T results in more accurate detection than detecting the position by using the first probing beam.

Figure 12A:
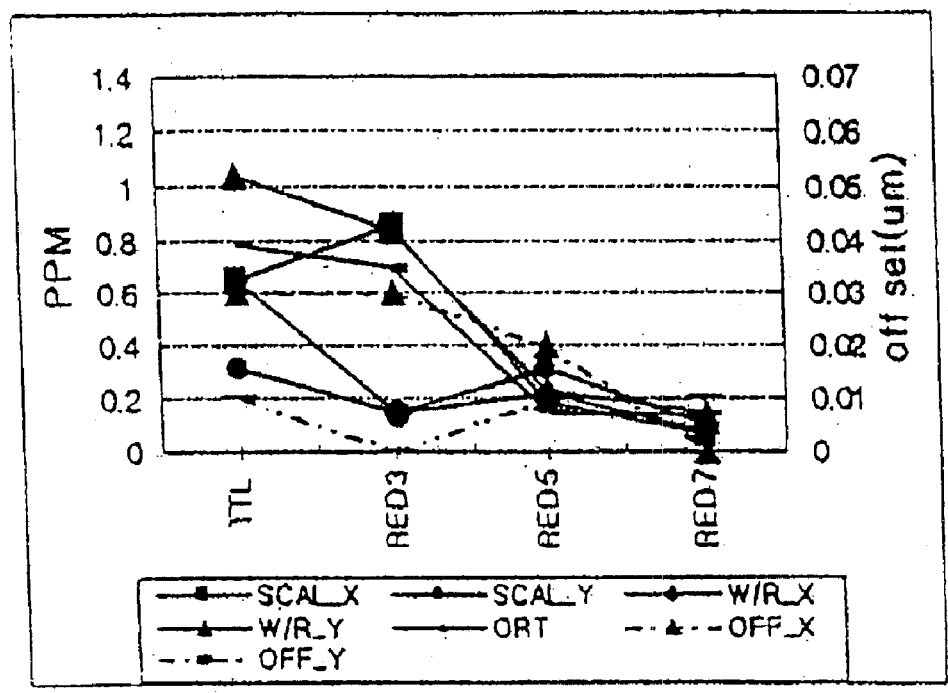
FIGS. 12A through 14B are graphs showing the range of detection error by the first probing beam to unit marks, the range of detection error by the second probing beam to mesa or trench patterns which result in subdividing into a plurality of diffraction orders in unit marks, and the measurement value for alignments according to each of embodiments.
Figure 12B:
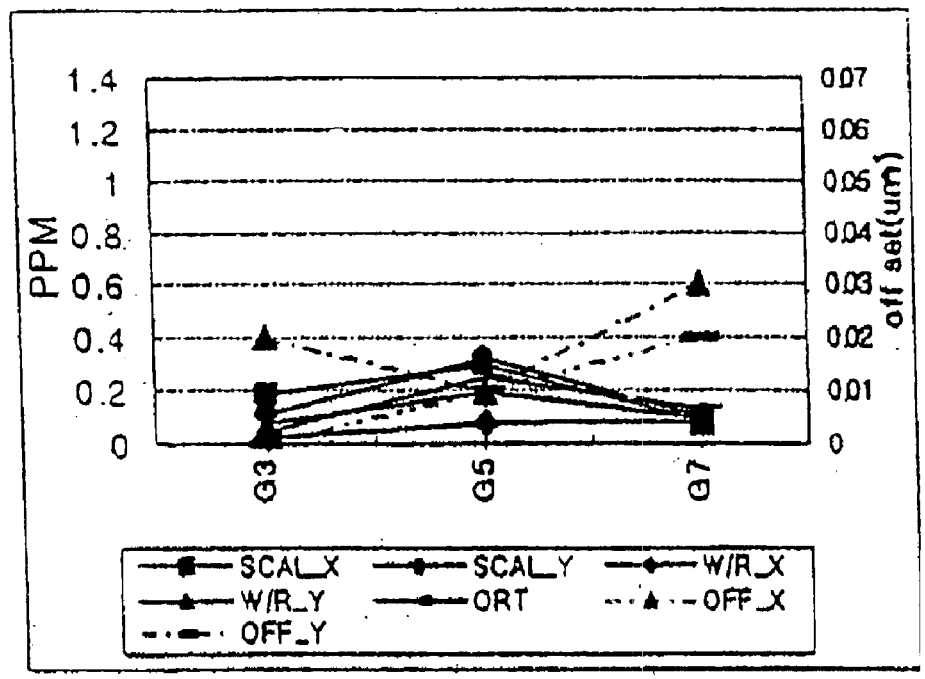

FIG. 12A shows the detection error of the wafer aligning position in X axis, Y axis, and rotation direction when a 633 nm red color laser beam (first probing beam) is used for illuminating the conventional unit marks. FIG. 12B shows the detection error of the wafer aligning position in X axis, Y axis, and rotation direction when a 532 nm green color laser beam (second probing beam) is used for illuminating the conventional unit marks.

Comparison of these results indicates that the more the number of the unit marks (diffraction order) increase, the more the error range in detection of the wafer alignment position decreases. This result can be confirmed by the following Fourier transform formula.

Figure 1A:
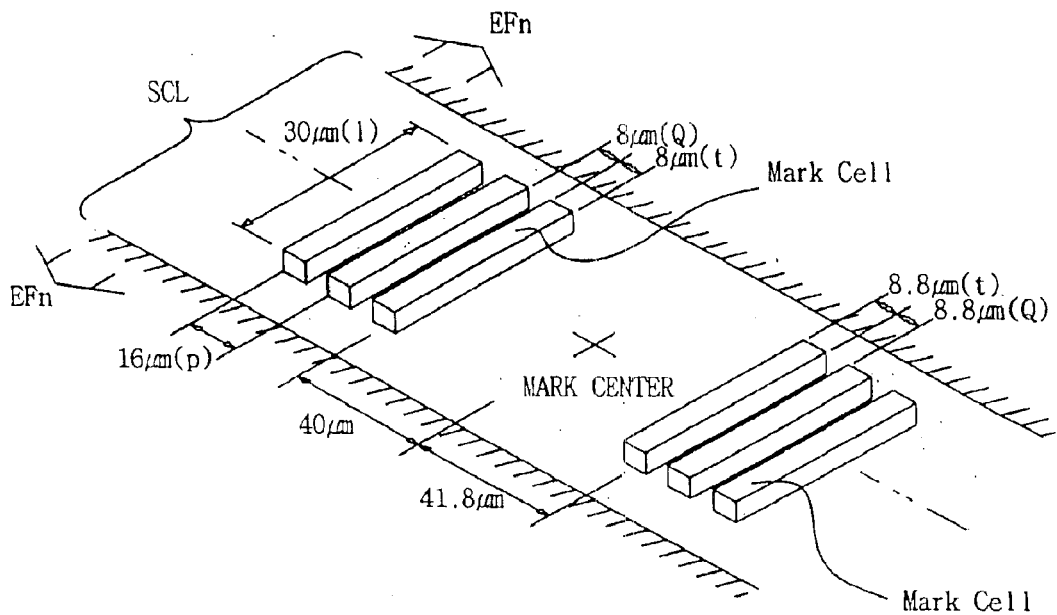
FIGS. 1A through 2B are perspective views showing examples of conventional alignment marks.
Figure 1B:
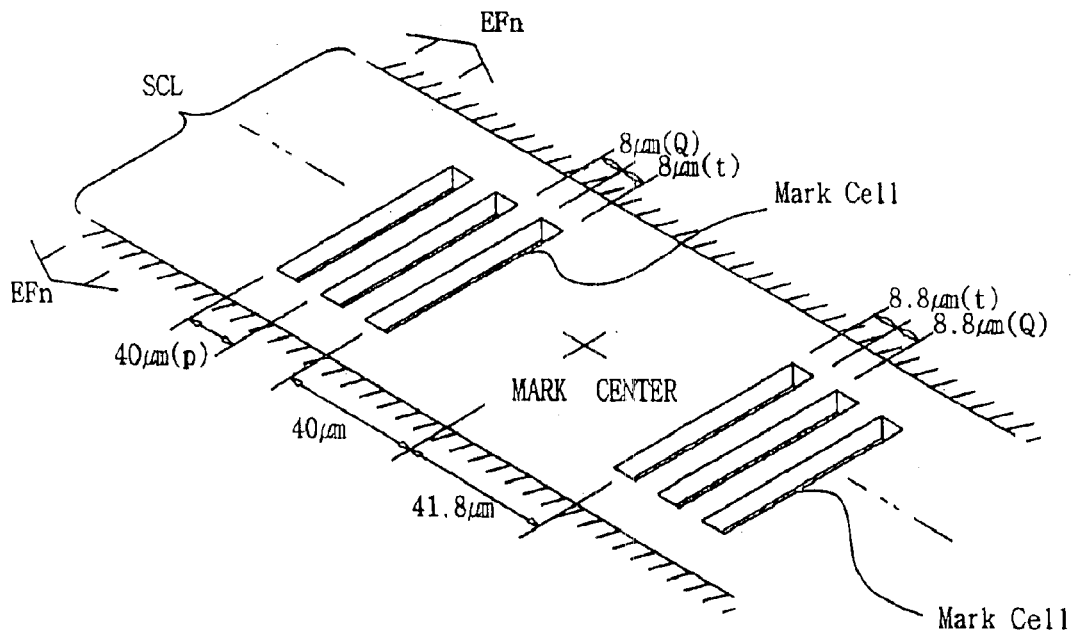
Figure 2A:
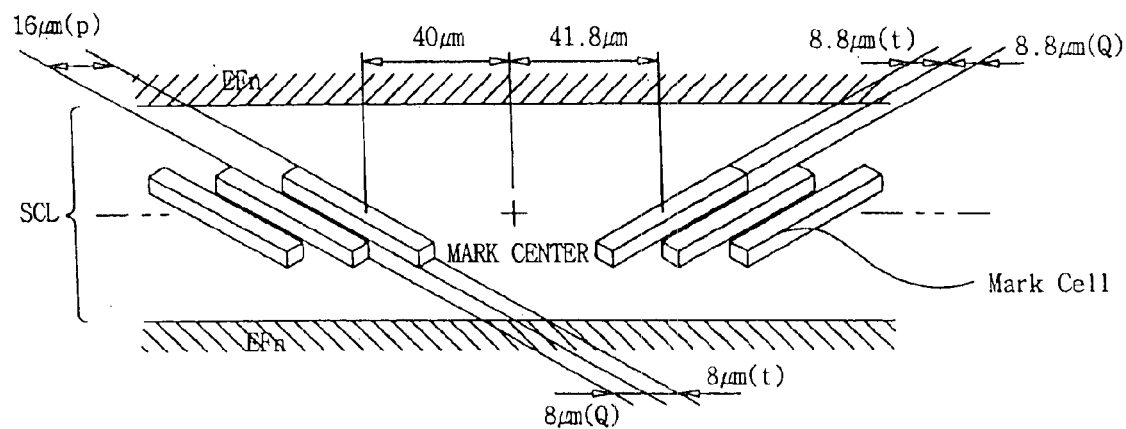
Figure 2B:
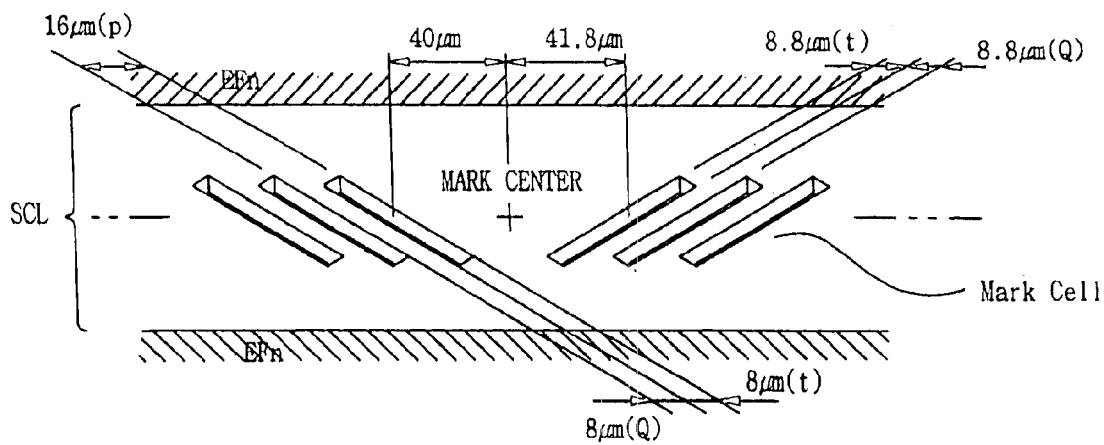
Figure 3:
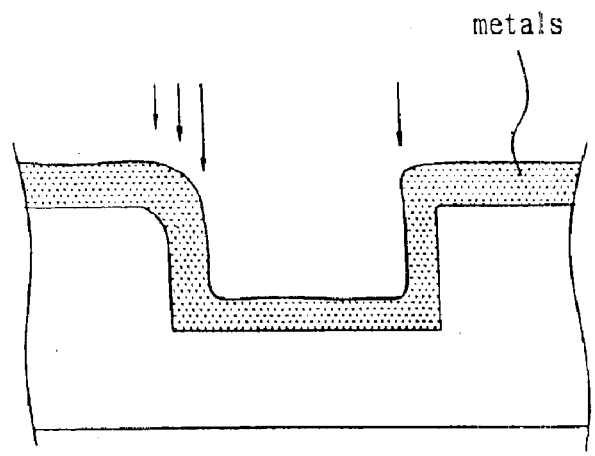
FIG. 3 is a cross-sectional view of width direction of the unit mark shown in FIGS. 1A through 2B.
Figure 4:
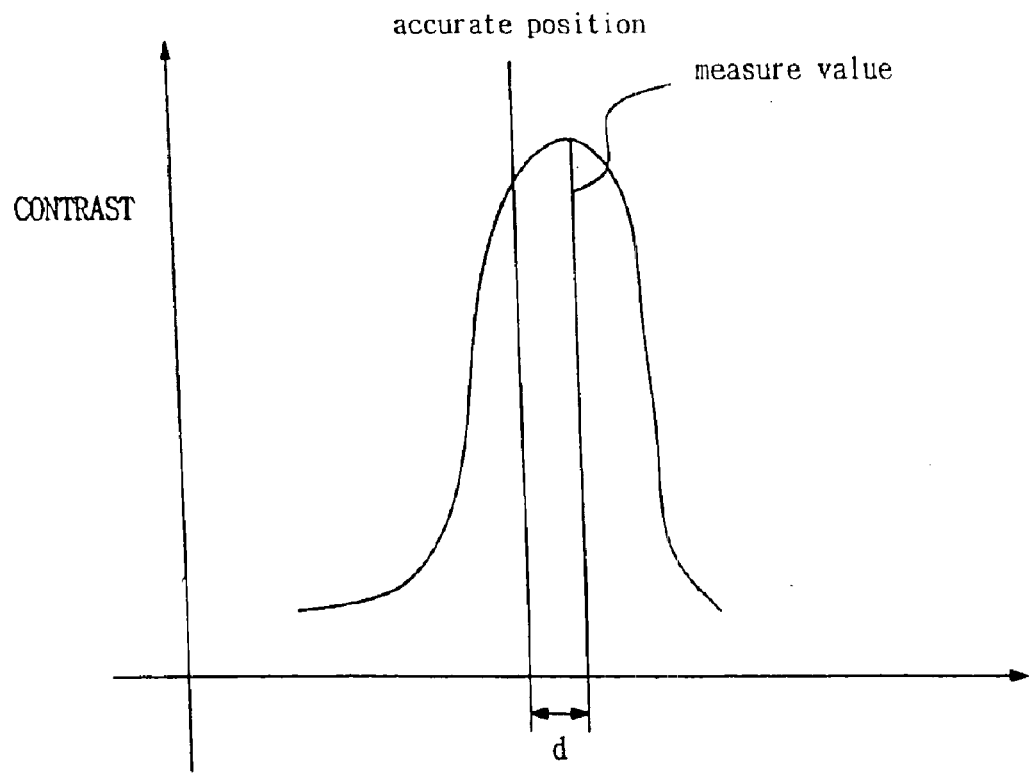
FIG. 4 is a graph illustrating the relationship of error range and contrast according to the unit mark type.
Figure 5:
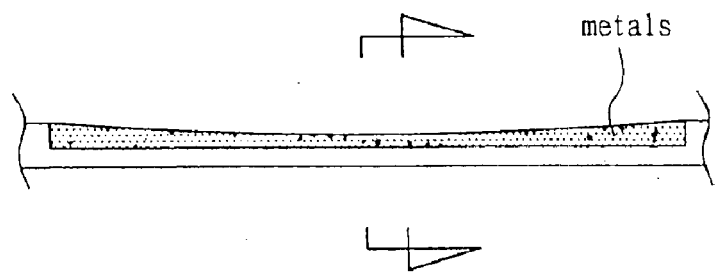
FIG. 5 is a cross-sectional view of length direction of the unit mark shown in FIGS. 1A through 2B, after a CMP process.
Figure 6:
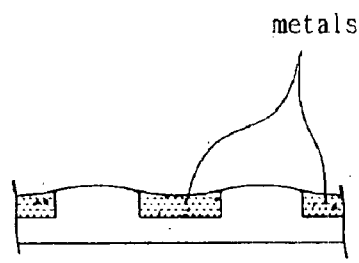
FIG. 6 is a cross-sectional view of width direction of the unit mark shown in FIGS. 1A through 2B, after a CMP process.
Figure 7:
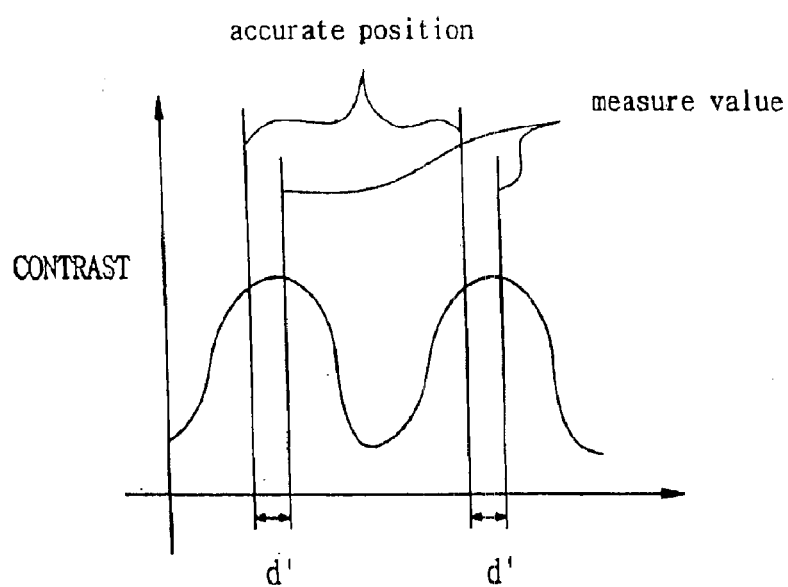
FIG. 7 is a graph illustrating the relationship of error range and contrast according to the unit mark form.

Formula:

$$f(x)=(4/\pi)\sin(x-a)+(4/3\pi)\sin(3x)+(4/5\pi)\sin(5x)+(4/7\pi)\sin(7x)+ \ldots$$
x: distance of mark center, a: measurement error However, as explained in the description of the conventional related art shown in FIG. 3 or 5, in case that each of the unit marks is detected in a distorted state of the shape, it is not reliable to depend on the detected position because the detection error to each of the unit marks is large in range.

In contrast, the detection by the second probing beam, which has a wavelength shorter than the first probing beam, is affected by the number of the unit marks according to the Fourier transform formula above, similar to the detection by the first probing beam. In addition, the detection by the second probing beam has a more reliable result than the detection by the second probing beam because the resultant error of the first probing beam is within a predetermined range.

Figure 13A:
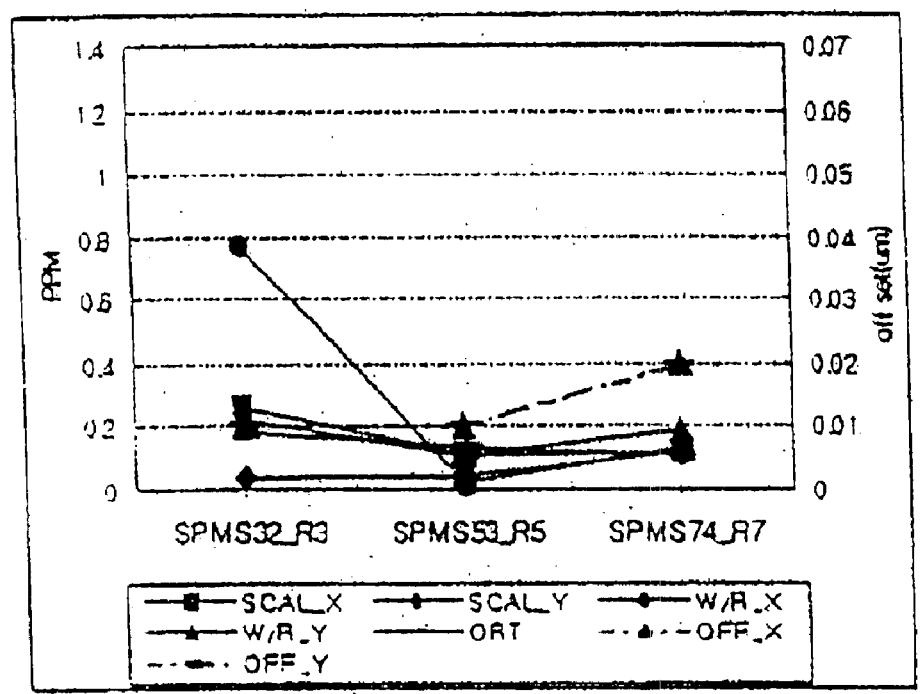

FIG. 13A shows a detection error obtained by using the first probing beam according to each of the diffraction orders in case that a mesa pattern M or trench pattern T is formed in a unit mark, which indicates that since the diffraction order is divided in more detail by the mesa pattern M or trench pattern T, the resultant detection error to the patterns formed in the unit mark is more reliable than the detection error to the conventional unit mark itself.

Such a mesa pattern M or trench pattern T serves to decrease damage of the mark shape caused by a CMP process due to density of the patterns, thereby resulting in more accurate detection result.

Figure 13B:
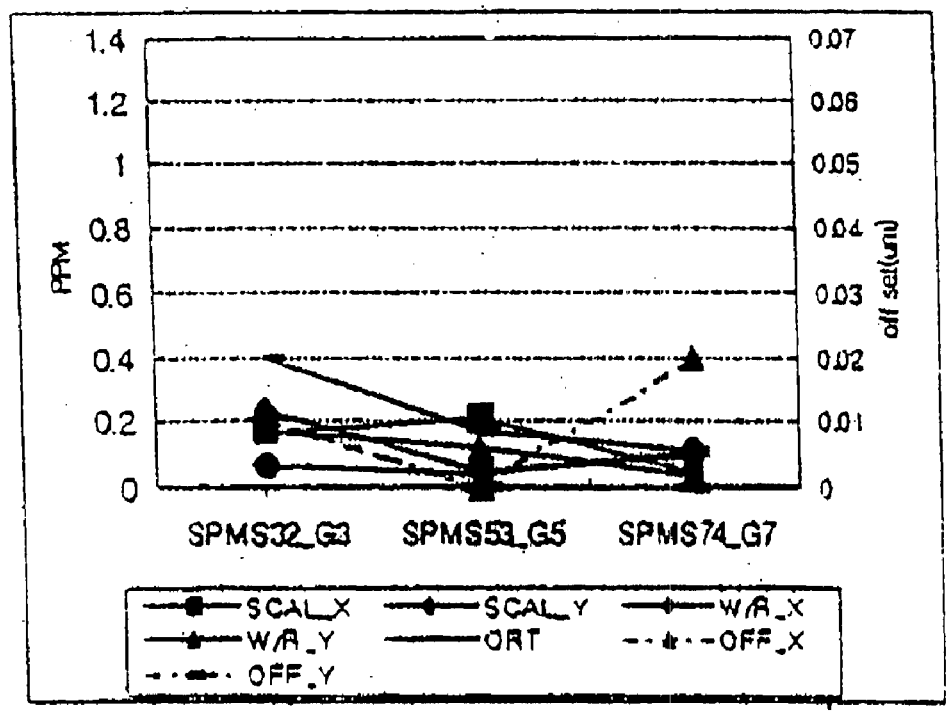

The detection error shown in FIG. 13B is obtained by illuminating a unit mark, in which a mesa pattern M or trench pattern T is formed, with the second probing beam. The pattern pitch P' of the mesa pattern M or trench pattern T is formed according to the formula P'=P/(2n'+1), which results from wavelength of the second probing beam, thereby reducing the range of the detection error compared with the conventional detecting method.

Figure 14A:
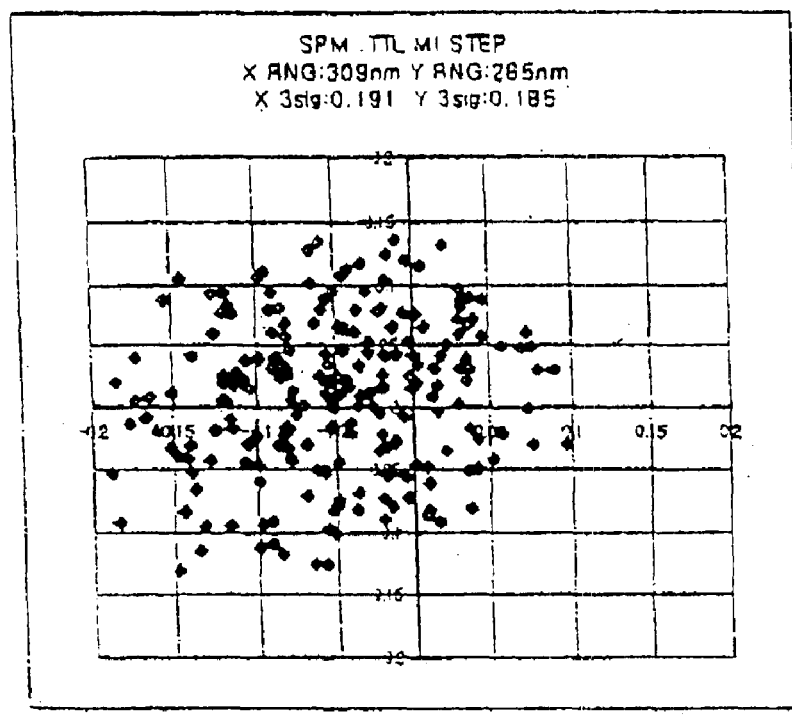
Figure 14B:
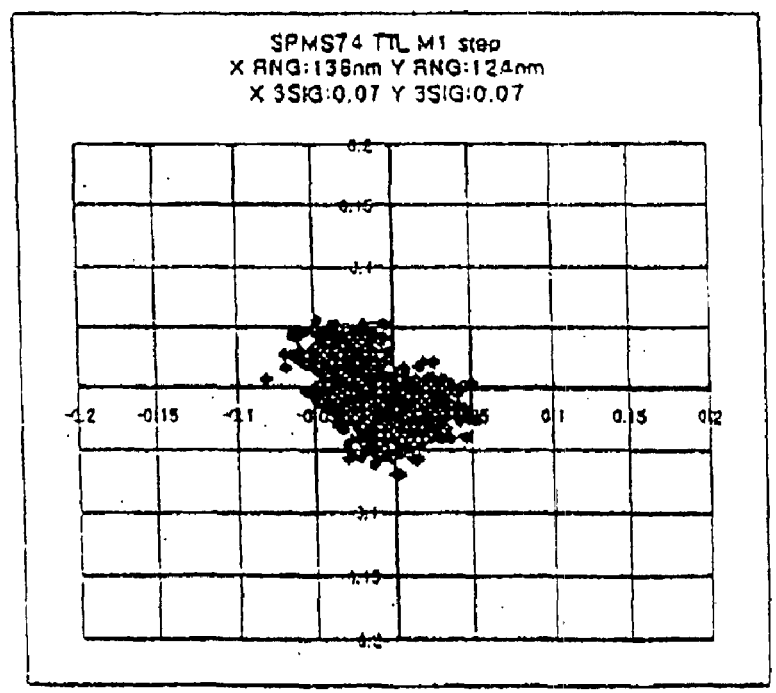

FIGS. 14A and 14B are graphs showing the distribution of the mark positions detected by the first probing beam according to the conventional art and the distribution of the mark positions detected by the second probing beam according to the present invention, by which detection reliability in the alignment position detection can be compared.

It is important to note that since the gap q between the patterns is very short, the edge portion of the unit mark formed with mesa or trench pattern therein may be damaged when the gap is filled with metal etc., thus, the relationship between the gap q, width t', density, that is, pattern pitch P' etc. should be considered.

The most desirable gaps between the mesa pattern M or trench pattern T, that is, width t' and pattern pitch P' of the mesa pattern M or trench pattern T, which are nearly similar to the gap in the size, are formed in the range of about 1.13 to 1.15 and about 2.27 to 2.29, respectively, to prevent the gaps from being filled with any processing layers and to meet the required density by a CMP process.

It may be proposed that a light source of the first probing beam for illuminating each of the unit marks and a light source of the second probing beam for illuminating the mesa pattern M or trench pattern T are separately provided in the alignment system.

In addition, an optical filter may be provided on the optical path of the light source to pass only a selected wavelength of the first probing beam and another optical filter may be provided on an optical path of the light source of the second probing beam to pass only a selected wavelength of the second probing beam.

According to the present invention, since a predetermined wavelength and another different wavelength beams can be selected to illuminate the mesa or trench pattern formed within each of the unit marks in the alignment system, the alignment system can be compatible with the conventional alignment system. And; using such two type different wavelength beams results in higher order diffraction beams diffracted from the alignment such as mesa or trench pattern, thereby allowing to align more accurately by selecting one among several different alignment mark types.

The formation of the mesa or trench pattern in the unit mark serves to prevent a dishing phenomenon and allows detection of more accurate mark center position due to its sufficiently close arrangement for preparing against the CMP process.

While the present invention has been described in terms of preferred embodiments only, those skilled in the art will recognize that the invention can be practiced with modification within the sprit and scope of the appended claims.

What is claimed is:

1. An alignment mark in which a plurality of at least one of mesa and trench type unit marks are aligned with a predetermined gap therebetween in an underlying layer to which a chemical mechanical polishing process is applied so that alignment signals are formed during an alignment process, wherein:
   each of the mesa and trench type unit marks includes at least one or more of mesa and trench patterns, the mesa or trench patterns within each mesa or trench type unit mark being spaced sufficiently close together to prevent a dishing phenomenon during a chemical mechanical polishing process;
   the pattern pitch P' of the mesa and trench pattern formed within the mesa and trench unit marks is given by the formula $P'=P/(2n'+1) \pm 0.05$ µm (n': natural number); and
   $P \sin \theta = n\lambda$, P is pitch between unit marks, $\lambda$ is wavelength of a first probing beam illuminating the unit marks, $\theta$ is diffraction angle, n' is the number of mesa or trench patterns, n is diffraction order of the first probing beam illuminating the unit marks, $\lambda'$ is wavelength of a second probing beam for illuminating the mesa or trench patterns, $2n'+1$ is diffraction order by the wavelength $\lambda'$ of the second probing beam.

2. The alignment mark as claimed in claim 1, wherein the mesa pattern is formed with a predetermined pitch within the trench type of unit mark, and the trench pattern is formed with a predetermined pitch within the mesa type of unit mark.

3. The alignment mark as claimed in claim 1, wherein the mesa patterns and trench patterns are parallel to the lengthwise direction of the unit mark and aligned in a width direction of the unit mark in line, when the unit mark is formed in a rectangular shape having a predetermined length and width.

4. The alignment mark as claimed in claim 1, wherein when the pitch P between the unit marks is in the range of 7.8 to 8.2 µm, the pattern width t' and pattern pitch P' are formed in the range of 2.65–2.67 µm and in the range of 5–5.4 µm, respectively, when the diffraction order $2n'+1$ is 3, wherein the pattern width t' is the width of a single mesa or trench in a mesa pattern or trench pattern, respectively.

5. The alignment mark as claimed in claim 1, wherein when the pitch P between the unit marks is in the range of 7.8 to 8.2 µm, the pattern width t' and pattern pitch P' of at least one of the mesa and trench patterns are formed in the range of 1.59–1.61 µm and in the range of 3.1–3.3 µm, respectively, when the diffraction order $2n'+1$ is 5, wherein the pattern width t' is the width of a single mesa or trench in a mesa pattern or trench pattern, respectively.

6. The alignment mark as claimed in claim 1, wherein when the pitch P between the unit marks is in the range of 7.8 to 8.2 µm, the pattern width t' and pattern pitch P' of at least one of the mesa and trench patterns are formed in the range of 1.13–1.15 µm and in the range of 2.27–2.29 µm in its size, respectively, when the diffraction order $2n'+1$ is 7, wherein the pattern width t' is the width of a single mesa or trench in a mesa pattern or trench pattern, respectively.

* * * * *